(12) United States Patent
Preston et al.

(10) Patent No.: US 10,083,833 B1
(45) Date of Patent: Sep. 25, 2018

(54) INTEGRATION FILL TECHNIQUE

(71) Applicant: ARM Limited, Cambridge (GB)

(72) Inventors: Ronald Paxton Preston, Austin, TX (US); Marlin Wayne Frederick, Jr., Austin, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/629,684

(22) Filed: Jun. 21, 2017

(51) Int. Cl.
*H01L 21/033* (2006.01)

(52) U.S. Cl.
CPC .................. *H01L 21/0338* (2013.01)

(58) Field of Classification Search
CPC .................................................. H01L 21/0338
See application file for complete search history.

(56) References Cited

U.S. PATENT DOCUMENTS

2002/0155357 A1* 10/2002 LaCour ............... G03F 7/70441
430/5
2004/0209169 A1* 10/2004 Cui ........................... G03F 1/36
430/5

OTHER PUBLICATIONS

Liebmann, et al.; "Integrating DfM Components Into a Cohesive Design-To-Silicon Solution"; Design and Process Integration for Microelectronic Manufacturing III; SPIE Proceedings, vol. 5756; May 2005. DOI: 10.1117/12.604723.
Liebmann, et al.; "Layout Optimization at the Pinnacle of Optical Lithography"; Design and Process Integration for Microelectronic Manufacturing III; SPIE Proceedings, vol. 5042; Jul. 2003. DOI: 10.1117/12.485245.

* cited by examiner

*Primary Examiner* — Karen Kusumakar
(74) *Attorney, Agent, or Firm* — Pramudji Law Group PLLC; Ari Pramudji

(57) ABSTRACT

Various implementations described herein are directed to a method for manufacturing an integrated circuit. The method may include defining multiple lithographic regions for the integrated circuit, and the multiple lithographic regions may include a first lithographic region and a second lithographic region. The method may include defining an anchor in the first lithographic region and defining a target in the second lithographic region. The method may include defining a spacing interval between the anchor and the target. The method may include inserting an integration fill in the spacing interval.

20 Claims, 10 Drawing Sheets

INTEGRATION FILL TECHNIQUE

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Generally, electronic designers employ various techniques to design integrated circuits, such as physical chips and/or physical layers. In some situations, at advanced lithography nodes (where images being printed are smaller than the wavelength of light being used), it may be necessary that shapes on a given layer are aligned. Because of these shapes being printed smaller than the wavelength of light being used for the lithography, diffraction of the light being used becomes a significant problem.

A common solution to deal with diffraction is that some sort of a pattern of shapes and spaces is defined such that the shapes are printed successfully. Such a pattern may be comprised of a constant minimum width shape, w, and a constant space, s, that is repeated on a pitch, p, of p=w+s. This is only one such pattern. All the shapes on this layer may then be constructed with this repeating pitch. A lithographic structure is created with such a pattern on any given layer. If two lithographic structures are then placed adjacent to each other, they should be aligned such that the diffraction pattern created by the second lithographic structure is aligned to the first lithographic structure so that no destructive interference occurs.

This alignment becomes much more difficult where there are multiple layers within a lithographic structure which use different pitches. If there are two different pitches on the two different layers, then the alignment between the two lithographic structures is typically resolved on a least common multiple between the two pitches on the two separate layers. However, as more layers are added with different pitches (or pattern requirements), then the solution of using a least common multiple becomes increasingly difficult to solve. It may result in significant spaces between such structures such that there results in a loss of density. Thus, there is a need for allowing a reasonable minimum space to be used between these two structures.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Figure 1A:
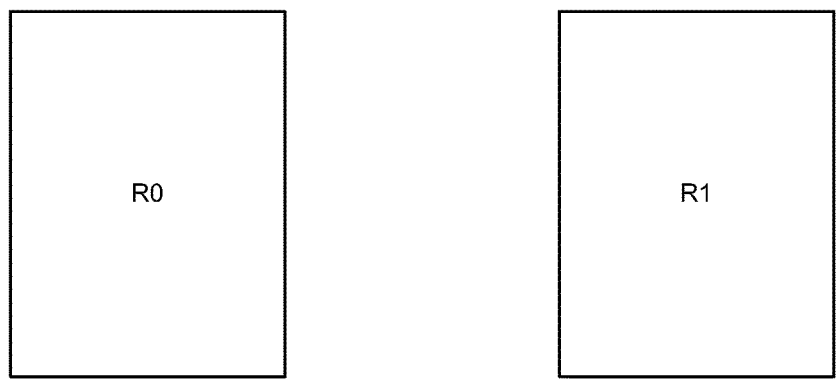
FIGS. 1A-1G illustrate various techniques for implementing integration fill in physical design in accordance with implementations described herein.

Various implementations described herein refer to implementing integration fill, such as, e.g., variable span integration fill (VSIF) in physical design.

VSIF refers to a method for interfacing blocks on an integrated circuit that allows a block (e.g., macro, memory, APR partition, etc.) to be designed once and placed in a consuming structure without need to strictly align interconnect wiring or match block size or stepping constraints between the block and the consuming structure. VSIF may be employed at any level of hierarchy throughout a complex integrated circuit design. Both the smaller block and the larger consuming structure may be macros, memories, or larger partitions that include logic cells, memories, macros, etc. The VSIF method (or the method for achieving VSIF) may be used to remove or relax requirements for fixed alignments of interconnect wiring to meet design rule requirements (between layers or across a single layer) as integration fill is added into the consuming structure to support the consumed block placement. The VSIF method may satisfy complex process design rules. VSIF may also remove requirements that the consumed block meet fixed or stepped sizing requirements, such as being sized to common multiples of the wiring or placements grids of the consuming structure as VSIF allows the consumed block's placement size to be adjusted to satisfy placement and stepping requirements imposed by the consuming structure. VSIF may also provide freedom for the manufacturing process to adjust the interfaced structures placed in the design to improve manufacturability. Concepts of VSIF and the method therefor may be applied to any design or process technology but are particularly valuable for advanced processes that may have strict interconnect design rules and that may have complicated system-on-a-chip (SOC) designs that have regions designed using multiple libraries, memories, wiring patterns, etc.

VSIF is a powerful technique that is applicable at multiple levels of integrated circuit design including: 1) block design and placement into larger consuming structures such as logic partitions created by automatic place/route tools, 2) logic partition placement inside larger logic partitions, and 3) integration of components at the full chip level. At the block design level, VSIF allows the memory or macro design to be achieved with fewer requirements of the consuming structure as to sizing or interconnect routing patterns. A single block design may be integrated into multiple logic place/route regions that use different libraries or have different routing track pattern definitions. At a logic partition level, VSIF allows for integration of sub-regions designed with a different set of basic assumptions, such as a different standard cell library or routing track pattern to be easily integrated without complicated interfacing. VSIF may be more area efficient as the sub-region is directly placed in the consuming structure without need to align its size or to create interfacing structures. At the full chip level, VSIF allows for simpler integration of blocks that may have been designed with different sizes, libraries, and interconnect routing patterns by creating a means for snapping component structures to a full chip standard and producing known interfaces between blocks without need to design complicated interface structures.

Accordingly, various methods and techniques for implementing integration fill in physical design will now be described herein with reference to FIGS. 1A-7.

Figure 1B:
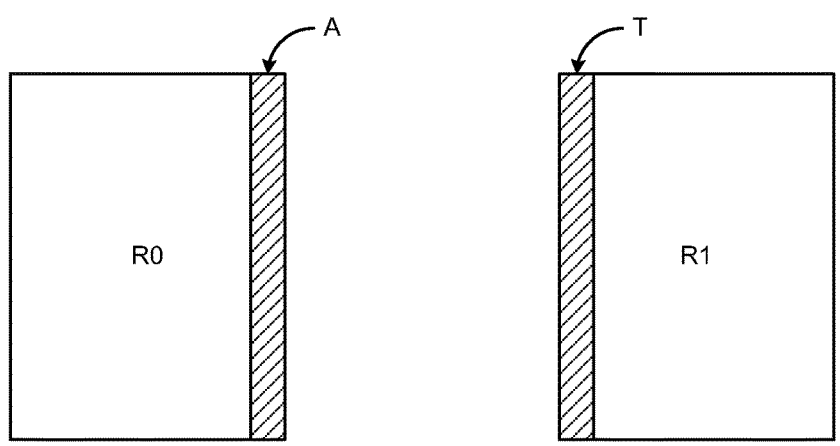
Figure 1C:
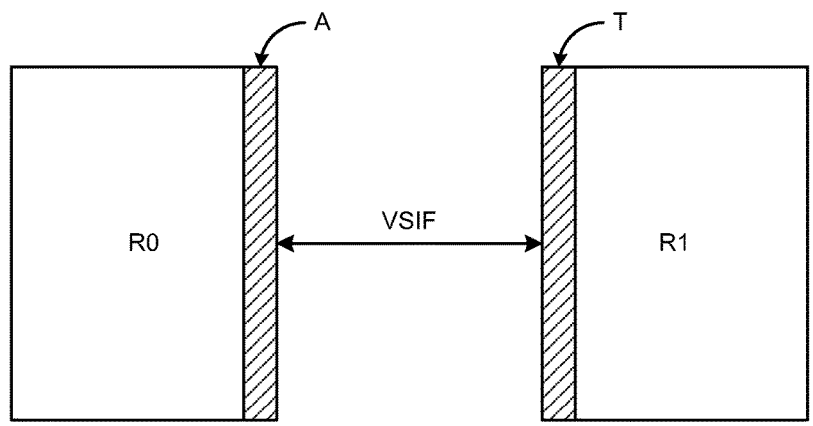
Figure 1D:
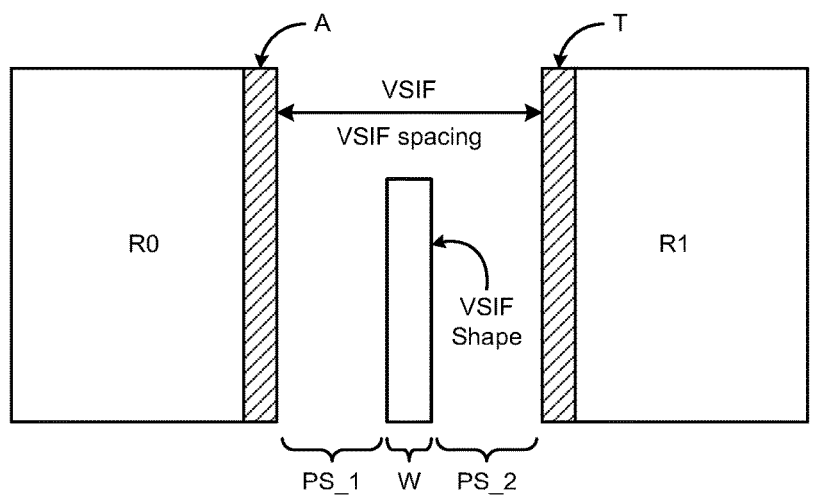
Figure 1E:
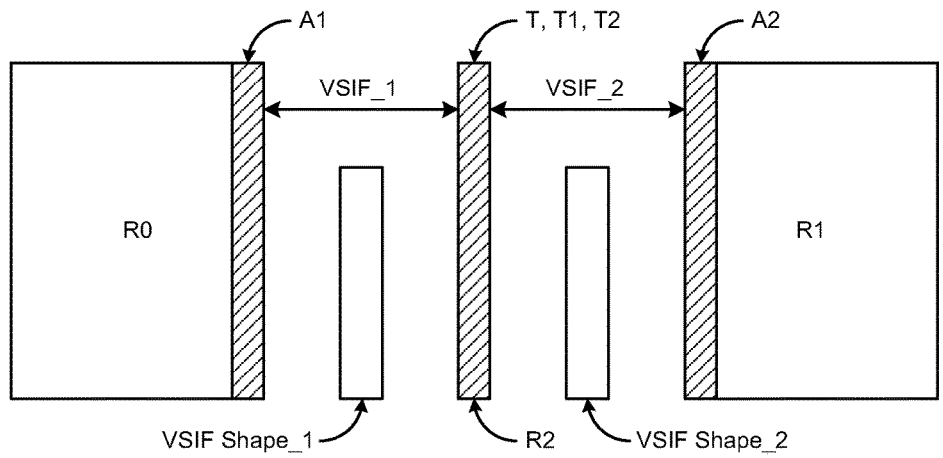
Figure 1F:
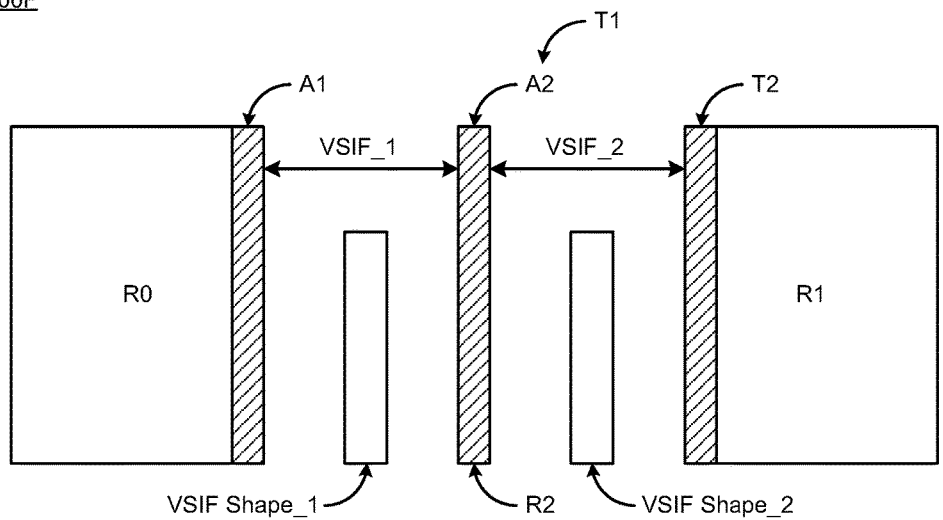
Figure 1G:
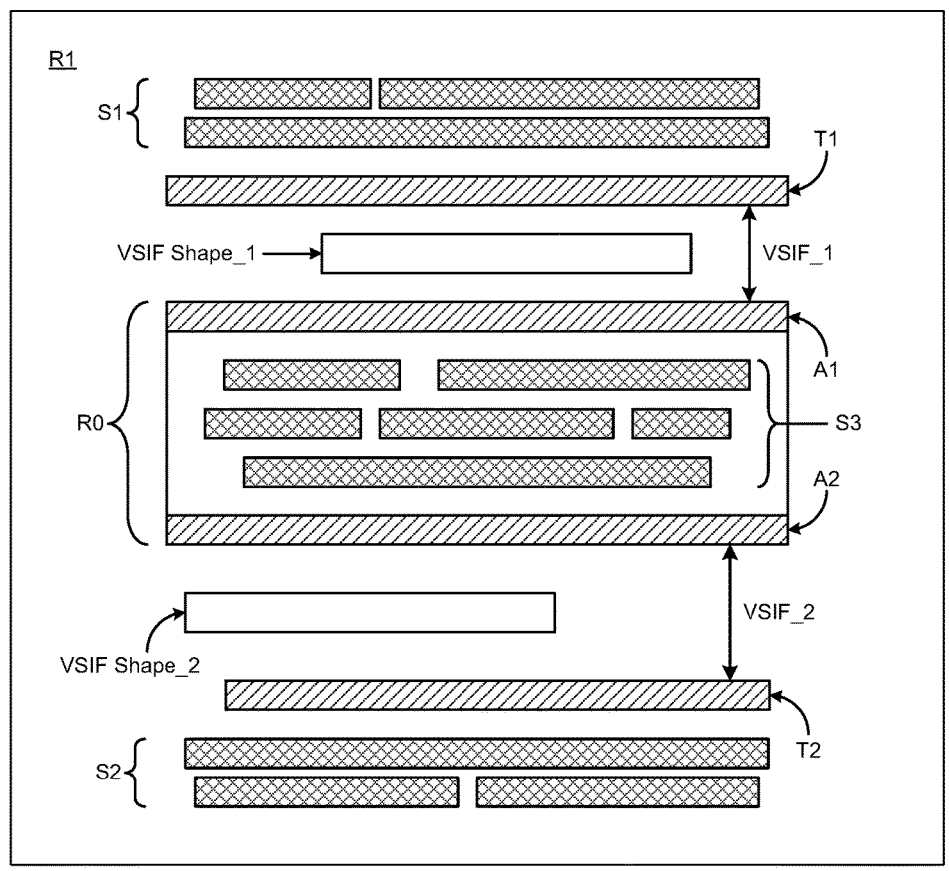

FIGS. 1A-1G illustrate schemes and techniques for implementing integration fill in physical design in accordance with implementations described herein. In particular, FIGS. 1A-1D illustrate a process flow of a technique for implementing integration fill in physical design, and FIGS. 1E-1G illustrate various other techniques for implementing integration fill in physical design.

Figure 6A:
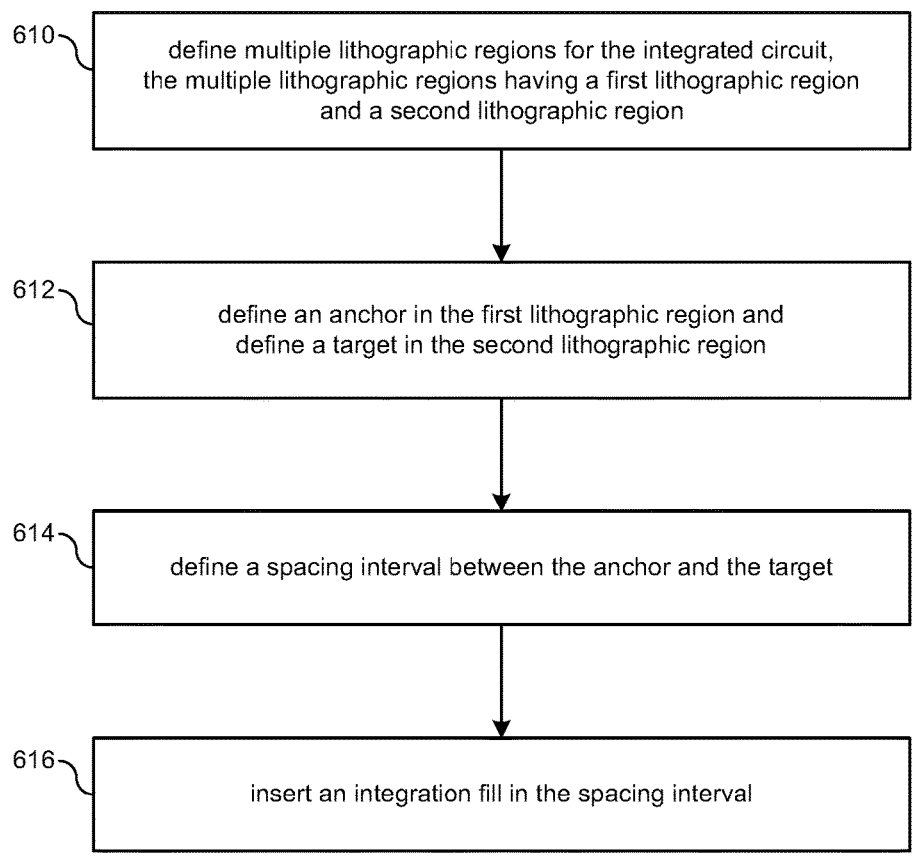
FIGS. 6A-6B illustrate various process diagrams of methods for implementing integration fill in physical design in accordance with implementations described herein.

In some implementations, FIGS. 1A-1D illustrate a process flow of a technique for implementing integration fill in physical design that may parallel the method 600A for FIG. 6A, which may be used to manufacture or fabricate an integrated circuit. The VSIF method may start with a block design. The block may refer to a component, such as, e.g., a memory or a macro design, or the block may refer to a larger logic region that includes standard cells and other structures, such as memories and macros. The VSIF method may utilize multiple attributes that are defined at multiple levels of hierarchy. The VSIF method may further utilize multiple lithographic regions for fabrication purposes.

As shown in diagram 100A of FIG. 1A, multiple lithographic regions may be defined for an integrated circuit, and the multiple lithographic regions may include a first lithographic region R0 and a second lithographic region R1. In various scenarios, the first and second lithographic regions may be adjacent or proximate to each other. Each of the multiple lithographic regions may include a block having a set of shapes with width and space definitions. The block may be a physical structure associated with the integrated circuit that is included in a place and route environment for electronic design automation (EDA). Each of the first and second lithographic regions R0, R1 may include a first fidelity set of one or more shapes having a first quality of detail.

In reference to FIG. 1A, multiple lithographic regions R0, R1 may be defined, wherein in some cases, R0 and R1 may be somewhat difficult to align closely. In some instances, the lithographic regions R0, R1 may include a full fidelity set of shapes, wherein a set of shapes may include at least one shape, and the shape may be a wire. In some implementations, shapes may include anything added to silicon to create a structure, such as, e.g., vias, gates, diffusion, contacts, interconnect and contacting wire, any component formed by lithography etc. In other implementations, shapes may include any component, pattern and/or structure that may be formed with lithography or similar deposition process. Further, shapes may have electrical properties, such as, e.g., conductance, capacitance, resistance, etc. A full fidelity shape may refer to a shape that meets design guidelines and may produce results that meet various required process specifications. Hence, the phrase "full fidelity" may be defined in terms of implementations where fidelity guidelines are "fully" met. A lithographic region may follow a "set of design rules" that may include a set of allowed spacing and width combinations for shapes and/or wires, and further, the design rules may define the allowed spacing and width combinations for adjacent shapes and/or wires. One embodiment of a lithographic region may be a block (e.g., a macro) that is defined as a set of shapes with both width and space definitions. The block may be a structure that is provided in a place and route environment, and the block may be able to work within the confines of the VSIF integration fill. R0 and R1 may be adjacent to each other. Alternatively, R0 may be wholly inside R1. A lithographic region may refer to a set of shapes across a single layer or alternatively, may also refer to a set of shapes across multiple layers. The alignment rules for lithographic regions may refer to lithographic regions spanning single and/or multiple lithographic layers. If each lithographic region has multiple lithographic layers, then the alignment of two multi-layer regions R0 and R1 may be affected by the shapes in the lithographic layers in the lithographic regions. The VSIF solution may be described in the context of aligning two lithographic regions across a single layer (e.g., in FIG. 5A) or aligning two lithographic regions affected by multiple layers (e.g., in FIG. 5B). Without this VSIF solution, across multiple layers (imagine a stack), edges of lithographic regions should align based on the specific lithographic scheme and design rules. As layers are added to lithographic regions, alignment may become increasingly difficult.

As shown in diagram 100B of FIG. 1B, an anchor A may be defined in the first lithographic region R0, and a target T may be defined in the second lithographic region R1. The anchor A and the target T may refer to particular component shapes, such as, e.g., an anchor shape and a target shape, respectively. In some scenarios, the anchor A may be disposed adjacent to an edge of the first lithographic region R0, and the target T may be disposed adjacent to an edge of the second lithographic region R1. However, in various other scenarios, the anchor A may be disposed away from an edge of the first lithographic region R0, and/or the target T may be disposed away from an edge of the second lithographic region R1. Generally, the anchor A and the target T are reflexive in that the anchor could be defined in R1, and the target could be defined in R0.

In reference to FIG. 1B, the anchor A is defined in the first lithographic region R0, and a target T is defined in the second lithographic region R1. The anchor A is defined with a set of shapes in R0, and the target T is defined with a set of shapes in R1, wherein a set has one or more shapes, and each shape in the set of shapes may have multiple widths and spacing. The anchor A and/or the target T may be full fidelity or lessor fidelity. If full fidelity, the anchor A and/or the target T may or may not have a specific design purpose, except to provide a specific VSIF solution. In some embodiments, the anchor A and/or the target T may be a full fidelity shape that is disposed at an edge of a lithographic region (e.g., R0, R1), where neither the anchor nor the target may be used for a specific design purpose, except for providing a VSIF solution. In some embodiments, the anchor A and/or the target T may be completely reflexive, wherein the anchor A may be the target T and vice-versa. Moreover, the shapes defining the anchor A may be in R1, and the shapes defining the Target T may be in R0.

Generally, a lithographic region may begin with an initial design and include devices and interconnects used for correct function of the block. For instance, devices may refer to shapes that may include anything added to silicon to create a structure, such as, e.g., vias, gates, diffusion, contacts, interconnect and contacting wire, any component formed by lithography etc. In some instances, shapes may include any component, pattern and/or structure that may be formed with lithography or similar deposition process. Further, shapes may have electrical properties, such as, e.g., conductance, capacitance, resistance, etc. Some interconnect shapes or wires used for proper functioning of the block may be referred to as "design wires". The presence of the design wires along with the various parasitic aspects, such as, e.g., resistance and capacitance, and coupling capacitances to other design wires may be maintained as the VSIF method is employed. An additional set of shapes of known width, spacing to design wires, and color (if applicable in the process) may be added to the lithographic region. These shapes may be referred to as anchor shapes or anchors. The specific design parameters of the anchor shapes (width, space to other design wires, and color) may vary between interconnect layers and in different processes but may be a constant for a given layer and process. In some embodiments, the anchor (and reflexively the target) may be added to a lithographic region (and not have a design purpose); however, other variations may still apply. The anchor may be an existing shape in a lithographic region. Further, the anchor may have a specific design purpose, and the anchor may be added to the lithographic region with a specific design purpose.

The anchor shape may be placed at a design rule legal position immediately outside of a last design shape in the block. The VSIF region may start at this point and project outward to a new resized VSIF block boundary. This topology may be used for consumed blocks, such as memories or macros, that may be placed within larger structures, such as logic place/route regions. The target shape may be defined in a similar manner as the anchor shape.

The anchor shape may be placed at a design rule legal block boundary. The VSIF region may start at this point and project inward into the block. This topology may be used at a logic partition level as it may define a known interface that may be shared between abutting blocks. The target shape may be defined in a similar manner as the anchor shape.

As shown in diagram 100C of FIG. 1C, a spacing interval may be referred to as a Variable Span Integration Fill (VSIF) region and may be defined between the anchor A and the target T. In some scenarios, the anchor A may be disposed separately from the target T, and the spacing interval VSIF may span a structural gap defined between the anchor A and the target T that allows for insertion of the integration fill therein.

In some implementations, in reference to FIG. 1C, the spacing interval VSIF may refer to a minimum space that is defined between the anchor A and the target T. The minimum space may be defined as at least one increment (1) larger than a normal space between the anchor A and the target T such that the anchor A and the target T are not considered to be in the same region, and large enough, e.g., at least two increments (2) larger, to introduce integration fill in the spacing interval VSIF. The minimum space may be defined using multiple techniques. For instance, some possible ways to define the minimum space may include the following. (1) After the anchor A and the target T have been defined, they may be marked using markers on a marker layer. Further, a design rule may be developed that checks whether there is enough minimum space in the space adjacent to the marked anchor A and the marked target T. (2) A blockage may be drawn that defines the space when defining the anchor A and the target T.

In reference to the spacing interval or VSIF region, a variable sized blank region (VSIF region) may be added to an edge of the consumed block. At least one side of the VSIF region may be coincident with the edge of the anchor shape. Further, the VSIF region may extend away from the anchor shape and may be disposed perpendicular to the routing direction of the layer by a known but variable amount. This region may be deliberately left blank during design of the block and may be filled in with integration fill shapes after the consumed block is placed into the consuming block. In some cases, a unique VSIF region may be added to the block for each interconnect layer present in the design. The placement position of each layer's region may be based upon the anchor shape and whether the VSIF region being defined is concave or convex.

The VSIF region may project outward from the anchor shape toward the block boundary. This may define a region that is devoid of design shapes on the outside of the block between the last design shape in the block and the design shapes of the consuming structure. The size of the VSIF region may be set such that a manufacturable set of fill shapes can be placed in the region resulting in a design rule legal construct. The placed fill shapes may not place any restrictions on the wiring in the consuming structure or the block being designed.

The VSIF region may project inward from the anchor shape toward the last design shape of the block being designed. This may define a region that is devoid of design shapes on the inside of the block between the block's boundary and the last design shape. The size of the VSIF region may be set such that a manufacturable set of fill shapes can be placed in the region resulting in a design rule legal construct. The anchor shape presents a known interface shape on the perimeter of the block that allows for direct abutment to other blocks using the same VSIF scheme. The placed fill shapes may not place any restrictions on design shapes in the block being designed.

The size of the VSIF region may be variable but known to be within a range that may allow successful generation of integration fill shapes post-placement. This size range may vary between interconnect layers and different processes, but may be a constant for a given process and interconnect layer. In some implementations, this may allow for consumed blocks, such as macros, to be designed independently of knowledge or requirements of the consuming block.

In reference to the target T in FIGS. 1B-1C, one side of the VSIF region may be bounded with the anchor shape, as described herein above, and the other side of the VSIF region may be bounded with the target shape, as described above. The target shape may be different from the anchor shape in that it is not required to be of a known width, spacing and/or color. In some examples, the target shape may be a valid design shape in a block or structure. The only design requirement on the target shape is that the target shape should be a consistent definition for an entire edge of the block. The target shape may not change location, width and/or color. There may be valid end-to-end cuts along the length of the target shape as necessary to implement the design function. Further, the integration fill process (as provided herein below) may set additional restrictions on the target shape; however, in a general case, any legal shape in the process may be used as a target shape, wherein the term "legal" refers to a particular fidelity description or design purpose.

The target shape may be the first design shape of the consuming block. The target shape may not be drawn in the consumed block, and the target shape's presence may not be known or needed during design of the block. When the consumed block is placed, the first shape in the consuming block beyond the VSIF edge may be the target shape.

The target shape may be a last design shape of the consumed block. In this case, the target shape may therefore be drawn as part of the consumed block's design.

As shown in diagram 100D of FIG. 1D, an integration fill (VSIF Shape) may be inserted in the spacing interval (or VSIF region). The integration fill (VSIF Shape) may be based on the anchor A, the target T and the spacing interval (VSIF and/or VSIF spacing). The integration fill (VSIF Shape) may comprise a second fidelity set of one or more shapes having a second quality of detail that is less than the first quality of detail. In this manner, the second fidelity may be generally the lessor fidelity. In some other implementations, the integration fill (VSIF Shape) may include a second fidelity set of one or more shapes having a similar quality of detail as the first quality of detail. Further, the anchor A may include a third fidelity set of one or more shapes having the first quality of detail or the second quality of detail, and the target T may include a fourth fidelity set of one or more shapes having the first quality of detail or the second quality of detail. Each of the first, second, third and fourth fidelity sets of shapes may have selectively variable widths and spacing.

The spacing interval VSIF may be referred to as a VSIF region having VSIF spacing with the integration fill (VSIF Shape) disposed therein. The integration fill (VSIF Shape) may have a defined width W with a first placement spacing PS_1 on a first side of the integration fill (VSIF Shape) and a second placement spacing PS_2 on a second side of the integration fill (VSIF Shape) that is opposite the first side. In some instances, a minimum width or space of the VSIF region may be defined to be at least two minimum width spaces and a minimum width that may be used to create a lessor fidelity shape. The minimum width of the VSIF region may be wider than that of two minimum spaces and the width of an SRAF structure (e.g., when the SRAF structure does not print). Further, the minimum space may be defined as (1) larger than a normal space between the anchor A and the target T such that the target T and anchor A are not in the same region, and (2) large enough to introduce integration fill.

In reference to FIG. 1D, the integration fill (VSIF Shape) may include a lesser-fidelity set of shapes with reduced manufacturability requirements (e.g., a set of shapes may include one or more shapes). In some embodiments, the integration fill may include full fidelity shapes along with lessor fidelity shapes, or even only full fidelity shapes. The integration fill may assist the lithography of R0 and R1, and the integration fill may have lower manufacturing tolerance for electrical parameters, such as resistance, capacitance, etc. The integration fill may provide no material defects to machinery or live circuitry, and the integration fill may include at least some allowably-printed shapes.

In some embodiments, the integration fill (i.e., inserting the VSIF Shape(s)) may refer to an integration fill procedure. In this instance, the final attribute of the VSIF method may be an integration fill procedure that creates integration fill shapes in the VSIF region post placement of the consumed block into the consuming structure. The specific design of the shapes in the VSIF region is left to the determination of the designer and/or foundry team. The shapes placed in the fill structure are not seen by the design and therefore may not be used for any design purpose. When the shapes are placed in the design, they are generally data-typed with a "fill purpose" that indicates that they are not required for the proper logical or electrical functioning of the design. Since these shapes are not needed for proper function of the design, these shapes may not need to meet any manufacturing fidelity requirements for resistance/capacitance/etc. This allows flexibility of the shapes placed into the fill region as those shapes are only necessary to support proper manufacturing requirements for the "design" purpose shapes. The fill shapes may be introduced for the purpose of assisting lithography which is a key component of VLSI chip build processes. The fill shapes and associated algorithm may be changed by the designer and/or foundry team as necessary to ensure high yield of the design. Generally, it is the responsibility of the manufacturing team to set the space range for the VSIF region, including the minimum and maximum spaces that are necessary to allow the IF procedure to be able to successfully create shapes.

Further, in some implementations, the specific integration fill may be defined as a function of the minimum space and the width and color of the target T. The minimum space may be variable beyond a minimum, where a minimum and a maximum (i.e., outer boundaries) may be defined for the spacing interval. Substance of the integration fill may be determined as part of the logic design or after during mask generation. Sub-Resolution Assist Features (SRAF) may also be introduced to the minimum space (in addition to or along with the integration fill).

FIGS. 1E-1F illustrate the first lithographic region R0, the second lithographic region R1 and a third lithographic region R2.

As shown in diagram 100E of FIG. 1E, the multiple lithographic regions may include the first lithographic region R0, the second lithographic region R1 and the third lithographic region R2. The third lithographic region R2 may be disposed between the first and second lithographic regions R0, R1. As shown, a first anchor A1 may be defined in the first lithographic region R0, and a second anchor A2 may be defined in the second lithographic region R1. Further, the third lithographic region R2 may be defined as a target T, which may be referred to as a first target T1 that is associated with the first anchor A1 and a second target T2 that is associated with the second anchor A2. As shown in FIG. 1E, a third lithography region R2 is a single lithographic shape, and this single shape could reflexively be considered either an anchor or a target.

As shown in FIG. 1E, a first spacing interval VSIF_1 may be defined between the first anchor A1 and the target T (i.e., T1), and a second spacing interval VSIF_2 may be defined between the second anchor A2 and the target T (i.e., T2). Further, as shown, a first integration fill (VSIF Shape_1) may be inserted in the first spacing interval VSIF_1, and a second integration fill (VSIF Shape_2) may be inserted in the second spacing interval VSIF_2.

In some other implementations, as shown in diagram 100F of FIG. 1F, the first anchor A1 may be defined in the first lithographic region R0, and the second anchor A2 may be defined in the third lithographic region R2. Further, as shown, the first target T1 may also be defined in the third lithographic region R2, and the second target T2 may be defined in the second lithographic region R1. The first target T1 is associated with the first anchor A1, and the second target T2 is associated with the second anchor A2.

Each of the first, second and/or third lithographic regions R0, R1, R2 may include a first fidelity set of one or more shapes having a first quality of detail. The first and second integration fills (VSIF Shape_1 and VSIF Shape_2) may include a second fidelity set of one or more shapes having a second quality of detail that is less than the first quality of detail. The first and second anchors A1, A2 may include a third fidelity set of one or more shapes having the first quality of detail or the second quality of detail. The one or more targets T (i.e., T1, T2) may include a fourth fidelity set of one or more shapes having the first quality of detail or the second quality of detail.

FIG. 1G illustrates the first lithographic region R0 being adjacent, proximate, and/or nested within the second lithographic region R1.

As shown in diagram 100G of FIG. 1G, the first lithographic region R0 may be nested within the second lithographic region R1. The second lithographic region R1 may include the first lithographic region R0, a first set of shapes S1, and a second set of shapes S2. The first lithographic region R0 may include a third set of shapes S3. The first anchor A1 (or first anchor shape) and the second anchor A2 (or second anchor shape) may be defined in the first lithographic region R0. The first target T1 (or first target shape) and the second target T2 (or second target shape) may be defined in the second lithographic region R1. The first spacing interval VSIF_1 may be defined between the first anchor A1 and the first target T1, and the second spacing interval VSIF_2 may be defined between the second anchor A2 and the second target T2. Further, as shown, the first integration fill (VSIF Shape_1) may be inserted in the first spacing interval VSIF_1 between the first anchor A1 and the first target T1, and the second integration fill (VSIF Shape_2) may be inserted in the second spacing interval VSIF_2 between the second anchor A2 and the second target T2.

Further, in reference to FIG. 1G, the first and second lithographic regions R0, R1 are disposed adjacent and/or proximate to each other. In some cases, this disposition of regions R0, R1 may refer to an embodiment where region R0 is nested within R1 or to an embodiment where region R1 completely encloses region R0. In this case, e.g., where region R0 is completely included inside region R1, the alignment of region R0 may be referred to as being aligned within region R1.

In connection with various techniques described herein, physical design may refer to uses in input/output (I/O), standard cells, and/or memory instances. Physical design may also be bounded to particular process nodes. Modifications in layout design may be used in partnership with proposed process modifications in selected regions of an integrated circuit or chip. These modifications may be implemented using various techniques described in this disclosure.

As described herein, the various design layers may be made by a variety of lithographic techniques, wherein each may create a unique set of requirements on full fidelity shapes, lessor fidelity shapes, and the minimum spacing interval between these various shapes. The various lithographic layers may be manufactured and/or fabricated with at least one specific lithography method or some combination of multiple lithography methods or with advanced lithography methods. Examples of lithography methods with various high-fidelity/low-fidelity constraints may include one or more of Litho-Etch-Litho-Etch (LELE), Litho-freeze-litho-etch (LFLE), and higher orders of LELE/LFLE including triple, quadruple, sextuple patterning, etc., generalized here as LEx. Some lithography methods may include self-aligned multiple patterning, both in cases of spacers defining lines and spacers defining spaces, and higher orders of self-aligned patterning including quadruple, octuple, etc., generalized here as SAxP. A specific advantage of this method for SAxP technologies may be in relaxing the need for full dummy fill between high fidelity regions due to difficulties associated with non-rectangular blocking mask shapes. Some lithography methods may include Extreme-ultra-violet (EUV), e.g., especially constraints that may be around EUV flare and related optical proximity correction (OPC) and spacing rules between regions of different design topology. Some lithography methods may include directed self-assembly (DSA), either grapho-epitaxy or chemo-epitaxy, especially relating to requirements of the underlying guiding patterns, which themselves may be patterned by the above lithography techniques. DSA templates for both line/space and contact/via hole (with various phases, such as, e.g., cylindrical and lamellar, formed by using block co-polymers (BCP), which may be applied to various techniques described herein.

Figure 2:
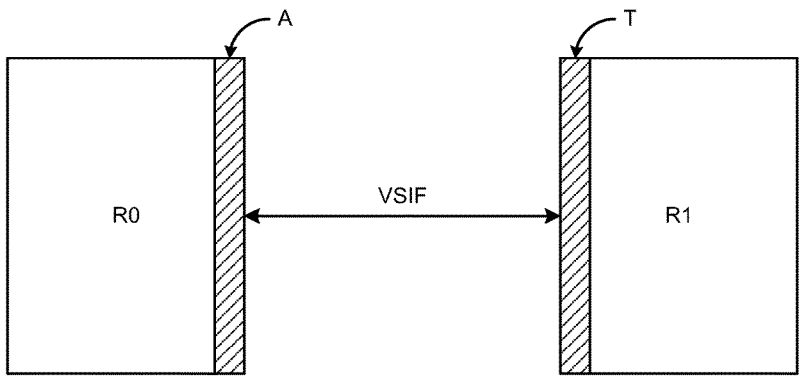
FIGS. 2-4 illustrate various techniques for implementing integration fill in physical design in accordance with implementations described herein.
Figure 2:
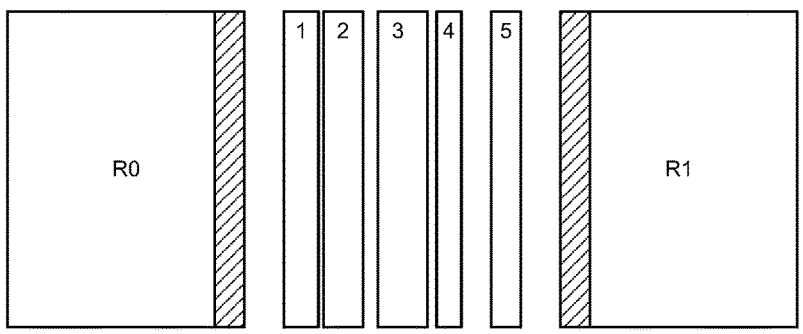
Figure 2:
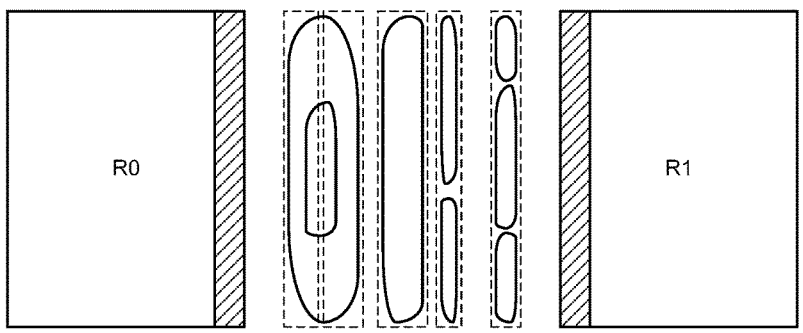
Figure 3:
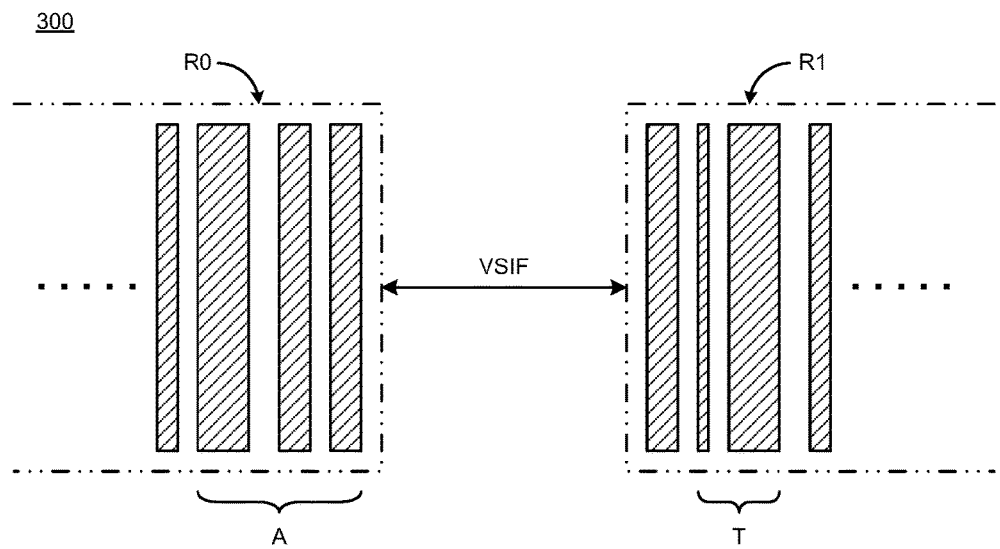
Figure 4:
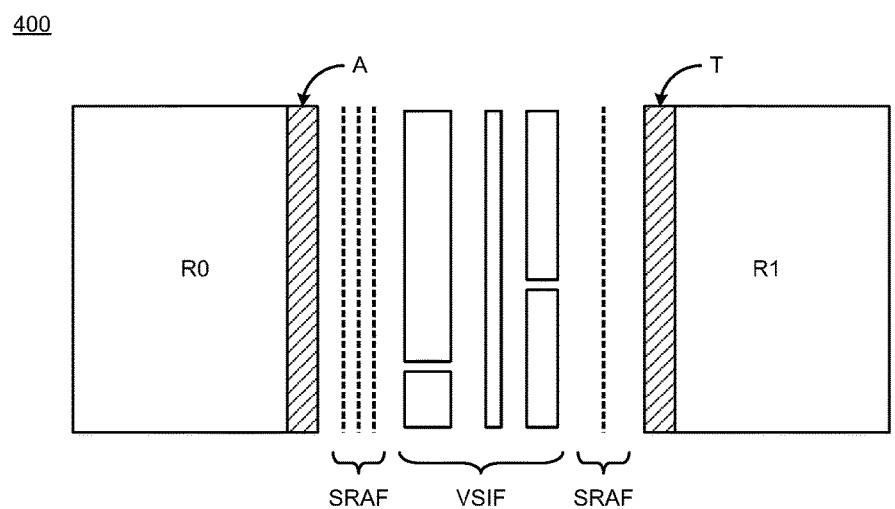

FIGS. 2-4 illustrate various other techniques for implementing integration fill in physical design in accordance with implementations described herein.

In some implementations, FIG. 2 illustrates a process flow 200 of a method utilizing a pre-fill operation 200A, a low fidelity layout/mask shapes operation 200B, and a post manufacturing print/etch operation 200C. The pre-fill operation 200A may refer to the described operations as performed in reference to FIGS. 1A-1C, wherein the anchor A, the target T, and the spacing interval VSIF are defined. The low fidelity layout/mask shapes operation 200B may refer to identifying one or more VSIF Shapes 1, 2, 3, 4, 5 for integration fill, which shows what the lessor fidelity fill may look like as it appears on the mask shape. In one example, as shown, there may be multiple fill shapes (e.g., 5) of varying width and space. The space between shape 1 and 2 may be smaller than the spaces between the other shapes. The width of the shapes 4 and 5 may be smaller than the widths of shapes 1, 2 and 3. As shown, lessor fidelity integration fill may have multiple widths or spacing.

Further, the post manufacturing print/etch operation 200C may refer to printing and/or etching of the actual shapes, e.g., within the outlined boundaries of the one or more VSIF Shapes 1, 2, 3, 4, 5 that are designated for integration fill. The operation 200C shows what the same region may look like after this layer has been manufactured, and the operation 200C refers to post lithography printing and etch. In some examples, the result of actual manufacturing shows that shapes 1 and 2 may be merged and/or shorted together in certain locations. This is due to the space between them being smaller. Shape 3 printed fully (no opens) and did not short to shapes 2 or 4. This may represent a full fidelity shape. Shapes 4 and 5 printed to some degree, but were either substantially narrow or had opens. This is due to their widths being smaller than shapes 1, 2 and 3. Note also that the full fidelity shapes shown (e.g., anchor and target) are printed in a full fidelity manner and without shorts or opens. The full fidelity shapes may not have been printed or manufactured properly without the lessor fidelity shapes in the VSIF region. There may be multiple combination of lessor fidelity shapes and full fidelity shapes that may be used to fill the VSIF space and assist in the lithography of the full fidelity shapes.

In some embodiments, lessor (or low) fidelity shapes may include shapes that may not be within the requirement of the design guide for full fidelity but which may print to some degree and which may fully assist lithography of full fidelity shapes. Manufacture of these lessor fidelity shapes may be less stringent (or easier or less restrictive in placement) and yet these lessor fidelity shapes may assist the full fidelity shapes to be manufacture-able and allows for a more optimum space between the two full fidelity lithography regions. These shapes are lessor fidelity because they do not meet the range of acceptable values as defined by the design guide. For instance, if the shape were a metal wire, and it printed but at a smaller width than that deemed acceptable by the design guide, then it may result in a higher resistance, which is not accepted as functional in a VLSI design space. Thus, in this instance, the shape may be outside specification for resistance, capacitance, inductance, and/or any other measurable parameter. It could also be printed in such a way that it causes a yield problem within the lessor fidelity VSIF space but has no affect outside of this space. I.e., if two lessor fidelity wires print wider than an acceptable width and short to each other, then these wires do not short to any full fidelity wires outside the VSIF space. Since the shapes in the VSIF region do not have to meet fidelity standards within their region, they may have yield issues in this region. Since the VSIF region does not have to be functional, then having a yield issue (short or open) within the region may be acceptable. However, to meet the standard of being valid lessor fidelity shapes, a restriction is that these shapes may cause no damage (either at initial testing time or later in life of the VLSI component) to the full fidelity region, and they may cause no damage to manufacturing equipment used to build VLSI wafers. Unacceptable shapes may further include shapes that might "lift off" or separate from the wafer and damage the manufacturing equipment being used.

FIG. 3 illustrates a diagram 300 where the anchor A and the target T may be disposed at an edge of a lithographic region (bordering the VSIF region) or disposed away from an edge of a lithographic region. For instance, as shown in FIG. 3, the anchor A may include multiple shapes (e.g., 3), and the anchor A may be disposed at an edge of the first lithographic region R0 that borders the VSIF region. The target T may also include multiple shapes (e.g., 2), and the target T may be disposed away from an edge of the second lithographic region R1. Therefore, the diagram 300 of FIG. 3 demonstrates the anchor A and/or the target T may be made up of multiple shapes, the shapes may have various sizes/widths, and the shapes may be located elsewhere in the corresponding lithographic region.

FIG. 4 illustrates a diagram 400 where the integration fill includes one or more Sub-Resolution Assist Features (SRAF), and insertion of the integration fill (VSIF or VSIF Shapes) may facilitate lithography of multiple lithographic regions, including the first and second lithographic regions R0, R1. For instance, this additional embodiment describes addition of SRAF to the minimum space (in addition to the integration fill VSIF). As with the integration fill, SRAFs may aid lithography of the full fidelity shapes in R0 and/or R1, but unlike integration fill, SRAFs are sub-resolution. As such, SRAFs may not appear as a visible shape after semiconductor fabrication is complete. As shown, FIG. 4 depicts an embodiment with SRAFs and integration fill in the VSIF region. However, an additional embodiment may include SRAFs, VSIF, and polish assist features (to assist with chemical mechanical polishing).

Figure 5A:
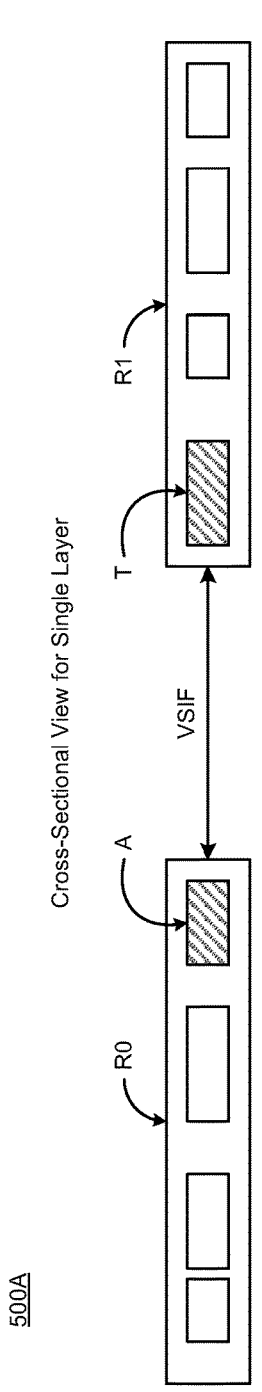
FIGS. 5A-5B illustrate single and multi-layering techniques for implementing integration fill in physical design in accordance with implementations described herein.
Figure 5B:
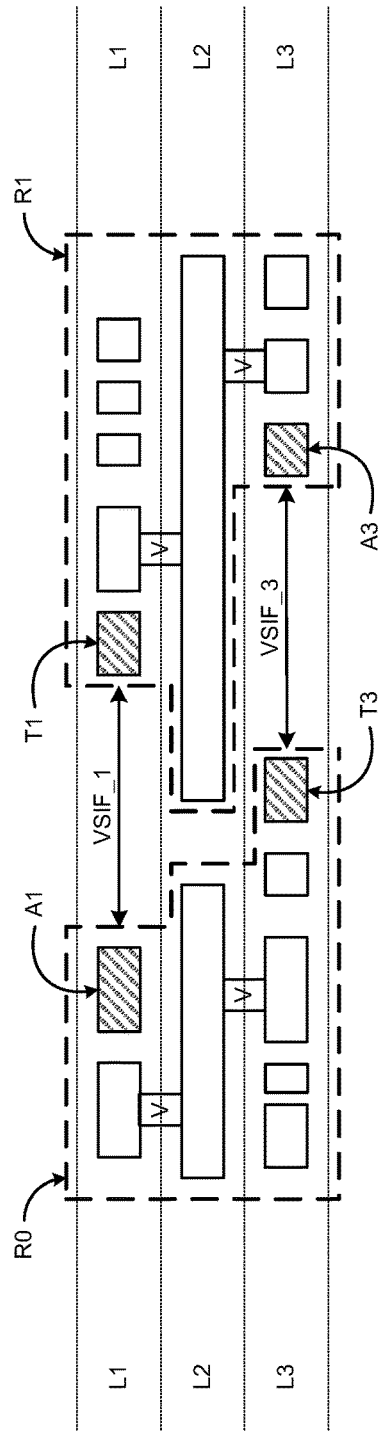

FIGS. 5A-5B illustrate single and multi-layering techniques for implementing integration fill in physical design in accordance with implementations described herein. In particular, FIG. 5A illustrates a cross-sectional view for a single layer 500A, and FIG. 5B illustrates a cross-sectional view of multi-layer 500B.

As shown, FIG. 5A provides a cross-sectional view of the lithographic regions R0, R1 occupying a single lithographic layer, and FIG. 5B provides a cross-sectional view of the lithographic regions R0, R1 occupying multiple lithographic layers including a first layer L1, a second layer L2 and a third layer L3.

In some scenarios, the first and second lithographic regions R0, R1 may be defined in the first layer L1, and the anchor A and the target T may be defined in the first layer L1. As shown in FIG. 5B, the anchor A and the target T may be defined across one or more layers. For instance, the anchor A and target T may refer to anchor A1 and target T1 defined in the first layer L1, or alternatively, the anchor A may refer to both A1 and A3 and the target T may refer to both T1 and T3. In the latter case, the anchor and target refer to more than one shape across more than one layer.

FIG. 5B illustrates the first lithographic region R0 and the second lithographic region R1, wherein each lithographic region R0, R1 is made up of routing multiple layers. As shown, the layers L1, L2, L3 may be embodied as metal layers, and there are also via layers (V) between the layers L1, L2, L3 that may affect VSIF analysis. The first layer L1, the second layer L2 and the third layer L3 are depicted, and one or more of the layers L1, L2, L3 may have to be aligned to appropriately place the regions. The second layer L2 is shown as an example of a layer that may be orthogonal to the first layer L1 and the third layer L3. The anchor A may include the shape labeled anchor A1 or both anchor A1 and anchor A3. Similarly, the target T may include the shape labeled target T1 or both the target T1 and the target T3. The shapes of the orthogonal layer L2 may or may not be included in the anchor or target. In an embodiment, where the first lithographic region R0 and the second lithographic region R1 span one or more layers, the corresponding integration fill may also be defined across one or more layers, as shown in FIG. 5B.

As shown in one embodiment, FIG. 5A provides a cross-sectional view of the lithographic regions R0, R1 occupying a single lithographic layer, and in another embodiment, FIG. 5B provides a cross-sectional view of the lithographic regions R0, R1 occupying multiple lithographic layers including a first layer L1, a second layer L2 and a third layer L3.

FIG. 5B illustrates the first lithographic region R0 and the second lithographic region R1, wherein each lithographic region R0, R1 is made up of multiple layers. The first layer L1, the second layer L2 and the third layer L3 are depicted. The layers L1, L2, and L3 may be referred to as metal layers. The second layer L2 is shown as an example of a layer that may be orthogonal to the first layer L1 and the third layer L3. Also, as shown, vias (V) connect the layers L1, L2, and L3. In some embodiments, the vias (or any other shape) may make up additional layers in the lithographic regions R0 and R1. As shown in FIG. 5B, the anchor A and the target T may be defined in each of the multiple layers. For instance, the anchor A and the target T may refer to anchor A1 and target T1 defined in the first layer L1, and, also, the anchor A and Target T may refer to anchor A3 and the target T3 defied in the third layer L3. To demonstrate reflexivity, lithographic region R0 includes both an anchor A1 in layer 1 as well as a target T3 in layer 3. A single lithographic region does not need to comprise only anchors or targets.

Where the lithographic regions R0 and R1 occupy multiple layers, unique anchors and targets are defined per each layer where integration fill is needed. In an embodiment where the first lithographic region R0 and the second lithographic region R1 span one or more layers, the corresponding integration fill may also be defined across one or more layers. As shown in FIG. 5B, integration fill may be added or inserted in spacing interval VSIF_1 and/or VSIF_3 between anchor-target combination A1/T1 and/or T3/A3, respectively. The spacing intervals VSIF_1, VSIF_3 do not need to be the same length across the various layers in a lithographic region. Additionally, the edge boundary of the lithographic region between various layers does not need to be vertically aligned to other layers. As shown in FIG. 5B, the shapes at the right most edge of lithographic region R0 are not vertically aligned. Although not illustrated, integration fill may also be added between the orthogonal shapes in L2 if an anchor, target, and spacing interval are appropriately defined. In an additional embodiment, integration fill may also be added between the vias (V) connecting the layers L1, L2, and L3.

FIG. 6A illustrates a process flow diagram of a method 600A for implementing integration fill in physical design in accordance with various implementations described herein. It should be understood that even though method 600A indicates a particular order of execution of operations, in some instances, certain portions of the operations may be executed in a different order, and on different systems. Additional operations or steps may be added to and/or omitted from method 600A. Further, computing device 700 of FIG. 7 may be configured to perform method 600A. In some instances, method 600A may be implemented as a program or software instruction process configured to mitigate contact resistance in physical design to improve performance.

In some implementations, method 600A may be utilized for manufacturing an integrated circuit. At block 610, method 600A may define multiple lithographic regions for the integrated circuit, wherein the multiple lithographic regions include a first lithographic region and a second lithographic region. Each of the multiple lithographic regions may refer to a block having a set of shapes with width and space definitions, and the block may represent a physical structure associated with the integrated circuit that is included in a place and route environment for electronic design automation (EDA). Each of the first and second lithographic regions may include a first fidelity set of one or more shapes having a first quality of detail. Further, the first and second lithographic regions may be adjacent to each other.

At block 612, method 600A may define an anchor in the first lithographic region and define a target in the second lithographic region. In some instances, the anchor may be disposed adjacent to an edge of the first lithographic region, and the target may be disposed adjacent to an edge of the second lithographic region.

At block 614, method 600A may define a spacing interval between the anchor and the target. At block 616, method 600A may insert an integration fill in the spacing interval. The integration fill may be based on the anchor, the target and the spacing interval. The integration fill may include a second fidelity set of one or more shapes having a second quality of detail that is less than the first quality of detail. In other cases, the integration fill may include a second fidelity set of one or more shapes having a similar quality of detail as the first quality of detail. The integration fill may also have a mixture of first quality of detail and second quality of detail that is less than the first quality of detail.

In some implementations, the anchor may include a third fidelity set of one or more shapes having the first quality of detail or the second quality of detail, and the target may include a fourth fidelity set of one or more shapes having the first quality of detail or the second quality of detail. Further, each of the first, second, third and fourth fidelity sets of shapes may have selectively variable widths and spacing.

In some implementations, the anchor may be disposed separately from the target, and the spacing interval may span a gap defined between the anchor and the target that allows insertion of the integration fill therein. Further, the integration fill may include one or more Sub-Resolution Assist Features (SRAF), and insertion of the integration fill may facilitate lithography of the first and second lithographic regions.

In some implementations, method 600A may further include aligning the first lithographic region with the second lithographic region such that at least one feature of the anchor in the first lithographic region is aligned with at least one feature of the target in the second lithographic region.

Further, the integrated circuit may include a single layer or multiple layers having a first layer and a second layer, and the anchor and the target may be defined in the first layer, and one or more other anchors and targets may be further defined in the second layer.

Figure 6B:
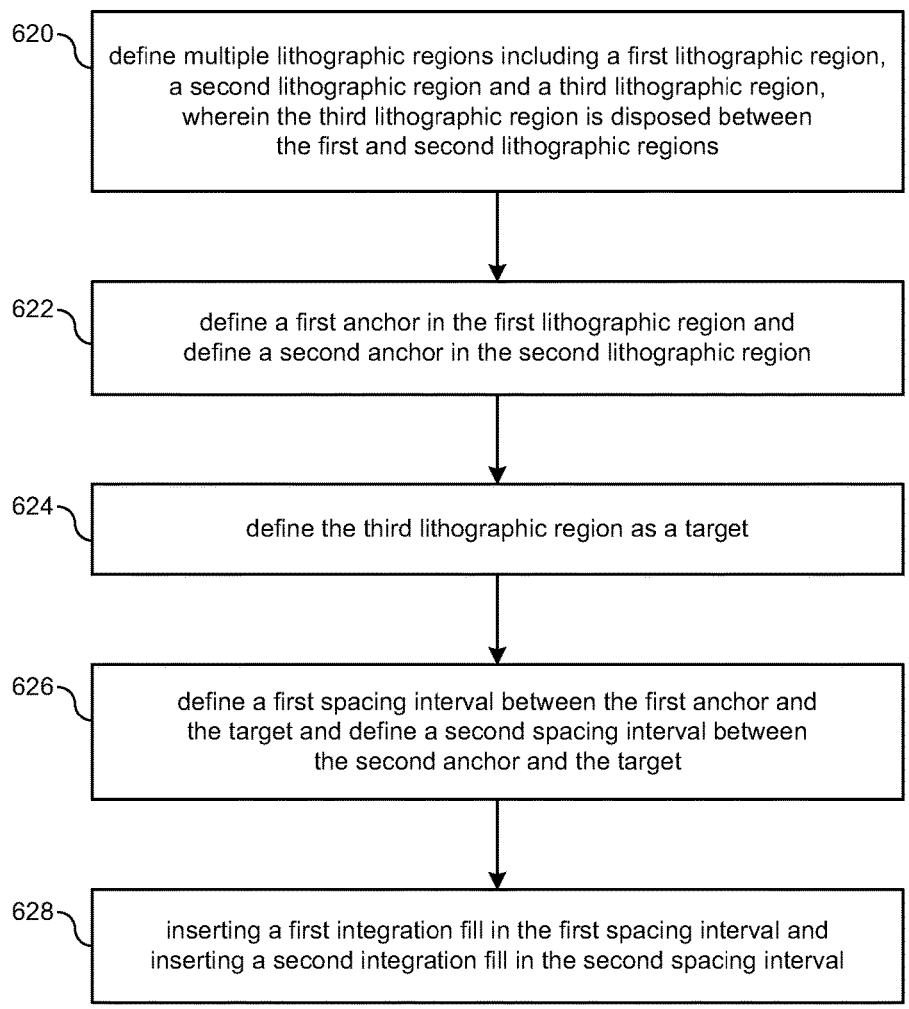

FIG. 6B illustrates a process flow diagram of a method 600B for implementing integration fill in physical design in accordance with various implementations described herein. It should be understood that even though method 600B indicates a particular order of execution of operations, in some instances, certain portions of the operations may be executed in a different order, and on different systems. Additional operations or steps may be added to and/or omitted from method 600B. Further, computing device 700 of FIG. 7 may be configured to perform method 600B. In some instances, method 600B may be implemented as a program or software instruction process configured to mitigate contact resistance in physical design to improve performance.

In some implementations, method 600B may be utilized for manufacturing an integrated circuit, e.g., as shown in reference to FIG. 1E. At block 620, method 600B may define multiple lithographic regions including a first lithographic region (e.g., R0), a second lithographic region (e.g., R1), and a third lithographic region (e.g., R2). The third lithographic region (e.g., R2) may be disposed between the first and second lithographic regions (e.g., R0, R1). At block 622, method 600B may define a first anchor (e.g., A1) in the first lithographic region (e.g., R0) and define a second anchor (e.g., A2) in the second lithographic region (e.g., R1). At block 624, method 600B may define the third lithographic region as a target (e.g., T, T1, T2). At block 626, method 600B may define a first spacing interval (e.g., VSIF_1) between the first anchor (e.g., A1) and the target (e.g., T, T1, T2) and define a second spacing interval (e.g., VSIF_2) between the second anchor (e.g., A2) and the target (e.g., T, T1, T2). At block 628, method 600B may insert a first integration fill (e.g., VSIF Shape_1) in the first spacing interval (e.g., VSIF_1) and insert a second integration fill (e.g., VSIF Shape_2) in the second spacing interval (e.g., VSIF_2). The first and second integration fills may be based on the anchors A1, A2, the target T and the spacing interval, respectively.

In some implementations, each of the multiple lithographic regions may refer to a block having a set of shapes with width and space definitions, and the block may be a physical structure associated with the integrated circuit that is included in a place and route environment for electronic design automation (EDA). Each of the first and second lithographic regions may have a first fidelity set of one or more shapes having a first quality of detail. The integration fill may have a second fidelity set of one or more shapes having a second quality of detail that is less than the first quality of detail. The first and second anchors may have a third fidelity set of one or more shapes having the first quality of detail or the second quality of detail. The target may have a fourth fidelity set of one or more shapes having the first quality of detail or the second quality of detail. The first and second integration fills may have one or more Sub-Resolution Assist Features (SRAF), and insertion of the first and second integration fills may facilitate lithography of the first and second lithographic regions.

Figure 7:
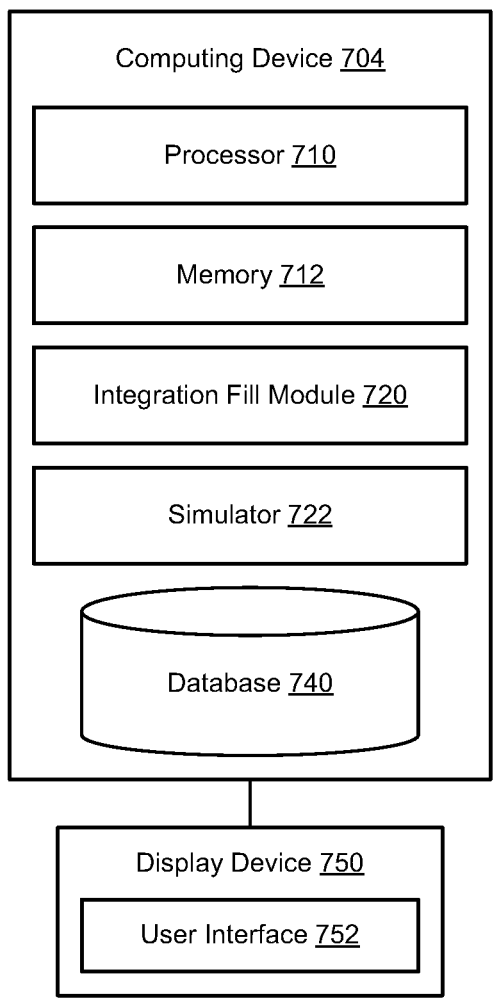
FIG. 7 illustrates a block diagram of a system for implementing integration fill in physical design in accordance with various implementations described herein.

FIG. 7 illustrates a diagram of a system 700 for implementing integration fill in physical design in accordance with various implementations described herein.

In reference to FIG. 7, the system 700 may be associated with at least one computing device 704 that is implemented as a special purpose machine configured for implementing integrated fill in physical design, as described herein. In some instances, the computing device 704 may include any standard element(s) and/or component(s), including at least one processor(s) 710, memory 712 (e.g., non-transitory computer-readable storage medium), one or more database (s) 740, power, peripherals, and various other computing elements and/or components that may not be specifically shown in FIG. 7. The computing device 704 may include instructions stored on the non-transitory computer-readable medium 712 that are executable by the at least one processor 710. The computing device 704 may be associated with a display device 750 (e.g., a monitor or other display) that may be used to provide a user interface (UI) 752, such as, e.g., a graphical user interface (GUI). In some instances, the UI 752 may be used to receive various parameters and/or preferences from a user for managing, operating, and/or utilizing the computing device 704. As such, the computing device 704 may include the display device 750 for providing output to a user, and the display device 750 may include the UI 752 for receiving input from the user.

In reference to FIG. 7, the computing device 704 may include an integration fill module 720 configured to cause the at least one processor 710 to implement one or more or all techniques described in reference to FIGS. 1A-6B, including techniques related to implementing integration fill in physical design. The integration fill module 720 may be implemented in hardware or software. If implemented in software, the integration fill module 720 may be stored in memory 712 or database 740. Further, if implemented in hardware, the integration fill module 720 may be a separate processing component configured to interface with the processor 710.

In various implementations, the integration fill module 720 may be configured to cause the at least one processor 710 to perform various techniques, as provided herein in reference to techniques described in FIGS. 1A-6B. In this instance, the memory 712 may have stored thereon instructions that, when executed by the processor 710, cause the processor 710 to perform one or more of the following operations.

For instance, integration fill module 720 may be configured to cause the at least one processor 710 to define a first lithographic region for the integrated circuit. The integration fill module 720 may be configured to cause the at least one processor 710 to define a second lithographic region for an integrated circuit. The integration fill module 720 may be configured to cause the at least one processor 710 to define an anchor in the first lithographic region. The integration fill module 720 may be configured to cause the at least one processor 710 to define a target in the second lithographic region. The integration fill module 720 may be configured to cause the at least one processor 710 to define a spacing interval between the anchor and the target. The integration fill module 720 may be configured to cause the at least one processor 710 to insert an integration fill in the spacing interval. In accordance with various implementations described herein in reference to FIGS. 1A-6B, any one or more or all of these operations performed by the integration fill module 720 may be altered, modified, or changed to thereby provide the various specific embodiments as shown in FIGS. 1A-6B. Further, as described herein, each of the first and second lithographic regions may comprise a block having a set of shapes with width and space definitions, and the block may comprise a physical structure associated with the integrated circuit that is included in a place and route environment for electronic design automation (EDA).

Further, in reference to FIG. 7, the computing device 704 may include a simulator module 722 configured to cause the at least one processor 710 to generate one or more simulations of the integrated circuit. The simulator module 722 may be referred to as a simulating component and may be implemented in hardware or software. If implemented in software, the simulator module 722 may be stored in memory 712 or database 740. If implemented in hardware, the simulator module 720 may be a separate processing component configured to interface with the processor 710. In some instances, the simulator module 722 may include a SPICE simulator configured to generate SPICE simulations of the integrated circuit. Generally, SPICE is an acronym for Simulation Program with Integrated Circuit Emphasis, which is an open source analog electronic circuit simulator. Further, SPICE is a general-purpose software program used by the semiconductor industry to check the integrity of integrated circuit designs and to predict the behavior of integrated circuit designs. Thus, in some instances, the integration fill module 720 may be configured to interface with the simulator module 722 to generate timing data based on one or more simulations (including, e.g., SPICE simulations) of an integrated circuit that may be utilized for analyzing performance characteristics of the integrated circuit including timing data of the integrated circuit. Further, the integration fill module 720 may be configured to use the one or more simulations (including, e.g., SPICE simulations) of an integrated circuit for evaluating operating conditions thereof.

In some implementations, the computing device 704 may include one or more databases 740 configured to store and/or record various data and information related to implementing integration fill in physical design. In various instances, the database(s) 740 may be configured to store and/or record data and information related to the integrated circuit, operating conditions, and/or timing data. Further, the database(s) 740 may be configured to store and/or record data and information related to the integrated circuit and timing data in reference to simulation data (including, e.g., SPICE simulation data).

There are many advantages for VSIF utilization. VSIF allows a block, such as, e.g., a memory or macro, to be designed once and used in multiple different placements without need for the block redesign to align to a consuming structure's interconnect wiring or placement sizing requirements. For instance, a block using VSIF may be placed into designs that may have different base stepping assumptions, such as different standard cell libraries. VSIF facilitates floor-planning by allowing structures with different sizes and routing patterns to be placed next to each other and aligned to any grid and/or stepping requirements of the consuming structure. For instance, blocks may be aligned to stepping requirements as VSIF allows for adjustment to block sizes. In another instance, complex interconnect design rule issues may be handled in the VSIF integration fill, thus avoiding the need to include interface structures or halos to match dissimilar interconnect structures between blocks or levels of hierarchy. Further, overall area may be reduced in a complex integrated circuit when VSIF is employed. The size adjustment capability of VSIF allows for usage of components, such as libraries and macros, across levels of hierarchies that may have disparate internal grid assumptions. In some instances, integrating these blocks together may align each block to a least common multiple of the grid assumptions between two blocks to obtain a consistent alignment between components for placement and/or integration. VSIF may be used to adjust the size of components to allow them to match up without resorting to a least common multiple value.

In some implementations, VSIF may also reduce area by avoiding the usage of wiring transitions or halo structures. In advanced processes with complex design rules, integrating design that have different interconnect assumptions or routing patterns often requires transitioning from the block's internal pattern to a known intermediate pattern and then a second transition from that pattern to the pattern of the other block. In some cases, this may be accomplished with a halo type structure that is placed around each block making the transition from an internal pattern to a known intermediate pattern. This halo may be present on both sides of an interface and may be costly in area. As such, VSIF may be used to reduce the size of the halos necessary. In cases related to integrating a memory into a logic partition, only a single VSIF region may be needed versus a double sized halo in a conventional scheme. In other cases, two VSIF regions may be placed next to each other, and since the integration fill shapes do not need to follow a predefined fixed pattern, the overall space needed to manage the transition may be reduced. In some instances, halos may include full fidelity shapes, and maintaining full fidelity halo shapes may lead to additional design restrictions and consume significant chip area.

Described herein are various implementations of a method for manufacturing an integrated circuit. The method may include defining multiple lithographic regions for the integrated circuit, and the multiple lithographic regions may include a first lithographic region and a second lithographic region. The method may include defining an anchor in the first lithographic region and defining a target in the second lithographic region. The method may include defining a spacing interval between the anchor and the target, and the method may include inserting an integration fill in the spacing interval.

Described herein are various implementations of a method for manufacturing an integrated circuit. The method may include defining multiple lithographic regions including a first lithographic region, a second lithographic region and a third lithographic region. The third lithographic region is disposed between the first and second lithographic regions. The method may include defining a first anchor in the first lithographic region and defining a second anchor in the second lithographic region. The method may include defining the third lithographic region as a target. The method may include defining a first spacing interval between the first anchor and the target and defining a second spacing interval between the second anchor and the target. The method may include inserting a first integration fill in the first spacing interval and inserting a second integration fill in the second spacing interval.

Described herein are implementations of a system for manufacturing an integrated circuit. The system may include a processor and memory having stored thereon instructions that, when executed by the processor, cause the processor to define a first lithographic region for the integrated circuit, define a second lithographic region for an integrated circuit, define an anchor in the first lithographic region, define a target in the second lithographic region, define a spacing interval between the anchor and the target, and insert an integration fill in the spacing interval.

Implementations of various technologies described herein may be operational with numerous general purpose or special purpose computing system environments or configurations. Examples of computing systems, environments, and/or configurations that may be suitable for use with the various technologies described herein include, but are not limited to, personal computers, server computers, hand-held or laptop devices, multiprocessor systems, microprocessor-based systems, set top boxes, programmable consumer electronics, network PCs, minicomputers, mainframe computers, smart phones, tablets, wearable computers, cloud computing systems, Variable computers, marine electronics devices, and the like.

The various technologies described herein may be implemented in the general context of computer-executable instructions, such as program modules, being executed by a computer. Program modules include routines, programs, objects, components, data structures, etc. that perform particular tasks or implement particular abstract data types. Further, each program module may be implemented in its own way, and all need not be implemented the same way. While program modules may execute on a single computing system, it should be appreciated that, in some implementations, program modules may be implemented on separate computing systems or devices adapted to communicate with one another. A program module may also be some combination of hardware and software where particular tasks performed by the program module may be done either through hardware, software, or some combination of both.

The various technologies described herein may be implemented in distributed computing environments where tasks are performed by remote processing devices that are linked through a communications network, e.g., by hardwired links, wireless links, or various combinations thereof. In a distributed computing environment, program modules may be located in both local and remote computer storage media including, for example, memory storage devices and similar.

Further, the discussion provided herein may be considered directed to certain specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for manufacturing an integrated circuit, the method comprising:
   defining multiple lithographic regions for the integrated circuit, the multiple lithographic regions having a first lithographic region and a second lithographic region;
   defining an anchor in the first lithographic region and defining a target in the second lithographic region;
   defining a spacing interval between the anchor and the target; and
   inserting an integration fill in the spacing interval, wherein the integration fill comprises one or more printed shapes based on the anchor and the target in the first and second lithographic regions.

2. The method of claim 1, wherein each of the multiple lithographic regions comprises a set of shapes with width and space definitions, and wherein the set of shapes comprises a physical structure associated with the integrated circuit.

3. The method of claim 1, wherein the integration fill provides an interface between the anchor and the target in the spacing interval in a post lithography operation.

4. The method of claim 1, wherein each of the first and second lithographic regions comprises a first fidelity set of one or more shapes having a first quality of detail.

5. The method of claim 4, wherein the integration fill comprises a second fidelity set of one or more shapes having a second quality of detail that is less than the first quality of detail.

6. The method of claim 5, wherein the anchor comprises a third fidelity set of one or more shapes having the first quality of detail or the second quality of detail, and wherein the target comprises a fourth fidelity set of one or more shapes having the first quality of detail or the second quality of detail.

7. The method of claim 5, wherein the second fidelity sets of shapes has variable widths and spacing.

8. A method for manufacturing an integrated circuit, the method comprising:
   defining multiple lithographic regions for the integrated circuit, the multiple lithographic regions having a first lithographic region and a second lithographic region, wherein each of the first and second lithographic regions comprises a first fidelity set of one or more shapes having a first quality of detail;
   defining an anchor in the first lithographic region and defining a target in the second lithographic region;
   defining a spacing interval between the anchor and the target; and
   inserting an integration fill in the spacing interval, wherein the integration fill comprises a second fidelity set of one or more shapes having a similar quality of detail as the first quality of detail.

9. The method of claim 1, wherein the first and second regions are adjacent or proximate to each other, or the first region is enclosed within the second region.

10. The method of claim 1, wherein the spacing interval spans a gap defined between the anchor and the target that allows insertion of the integration fill therein.

11. The method of claim 1, wherein the integration fill comprises one or more sub-resolution assist features (SRAF), and wherein insertion of the integration fill facilitates lithography of the first and second lithographic regions.

12. The method of claim 1, wherein the multiple lithographic regions are defined across a single layer of the integrated circuit.

13. A method for manufacturing an integrated circuit, the method comprising:
   defining multiple lithographic regions for the integrated circuit, the multiple lithographic regions having a first lithographic region and a second lithographic region;
   defining an anchor in the first lithographic region and defining a target in the second lithographic region;
   defining a spacing interval between the anchor and the target; and
   inserting an integration fill in the spacing interval, wherein the integrated circuit comprises multiple layers, and wherein the multiple lithographic regions are defined to occupy the multiple layers of the integrated circuit such that the anchor, the target and the integration fill are a first anchor, a first target and a first integration fill, respectively, defined across a first layer of the multiple layers, and wherein a second anchor, a second target and a second integration fill are defined across a second layer of the multiple layers.

14. A method for manufacturing an integrated circuit, the method comprising:
- defining multiple lithographic regions including a first lithographic region, a second lithographic region and a third lithographic region, wherein the third lithographic region is disposed between the first and second lithographic regions;
- defining a first anchor in the first lithographic region and defining a second anchor in the second lithographic region;
- defining the third lithographic region as a target;
- defining a first spacing interval between the first anchor and the target and defining a second spacing interval between the second anchor and the target;
- inserting a first integration fill in the first spacing interval and inserting a second integration fill in the second spacing interval.

15. The method of claim 14, wherein each of the multiple lithographic regions comprises a set of shapes with width and space definitions, and wherein the set of shapes comprises a physical structure associated with the integrated circuit.

16. The method of claim 14, wherein:
- each of the first and second lithographic regions comprises a first fidelity set of one or more shapes having a first quality of detail,
- the integration fill comprises a second fidelity set of one or more shapes having a second quality of detail that is less than the first quality of detail,
- the first and second anchors comprise a third fidelity set of one or more shapes having the first quality of detail or the second quality of detail, and
- the target comprises a fourth fidelity set of one or more shapes having the first quality of detail or the second quality of detail.

17. The method of claim 14, wherein the first and second integration fills comprise one or more sub-resolution assist features (SRAF), and wherein insertion of the first and second integration fills facilitate lithography of the first and second lithographic regions.

18. The method of claim 14, wherein the multiple lithographic regions are defined across a single layer of the integrated circuit.

19. A system for manufacturing an integrated circuit, the system comprising:
- a processor; and
- memory having stored thereon instructions that, when executed by the processor, cause the processor to:
  - define a first lithographic region for the integrated circuit;
  - define a second lithographic region for an integrated circuit;
  - define an anchor in the first lithographic region;
  - define a target in the second lithographic region;
  - define a spacing interval between the anchor and the target; and
  - insert an integration fill in the spacing interval, wherein the integration fill comprises one or more printed shapes based on the anchor and the target in the first and second lithographic regions.

20. The system of claim 19, wherein each of the first and second lithographic regions comprises a set of shapes with width and space definitions, and wherein the set of shapes comprises a physical structure associated with the integrated circuit.

* * * * *